United States Patent [19]
Reiner et al.

[11] Patent Number: 5,929,379
[45] Date of Patent: Jul. 27, 1999

[54] LOADCENTER SECONDARY DECORATIVE COVER

[75] Inventors: Richard A. Reiner, Hanover Township; Brendan A. Foley, Allison Park, both of Pa.

[73] Assignee: Eaton Corporation, Cleveland, Ohio

[21] Appl. No.: 08/953,689

[22] Filed: Oct. 17, 1997

[51] Int. Cl.⁶ .............................. H02G 3/14; H05K 5/03
[52] U.S. Cl. .............................................. 174/66; 220/241
[58] Field of Search ........................ 174/66, 67; 220/3.8, 220/241, 242; 361/654, 658; 33/528, DIG. 10

[56] References Cited

U.S. PATENT DOCUMENTS

| | | | |
|---|---|---|---|
| 3,598,900 | 8/1971 | Drake | 174/66 X |
| 3,618,804 | 11/1971 | Krause | 174/66 X |
| 3,808,509 | 4/1974 | Frazier | 174/66 X |
| 3,840,692 | 10/1974 | Wells | 174/66 |
| 4,835,343 | 5/1989 | Graef et al. | 174/66 |
| 5,144,099 | 9/1992 | Cardy | 174/66 |
| 5,557,828 | 9/1996 | Reiner et al. | 16/257 |
| 5,577,819 | 11/1996 | Olsen | 312/242 |
| 5,747,738 | 5/1998 | Indoe | 174/66 |

*Primary Examiner*—Dean A. Reichard
*Attorney, Agent, or Firm*—Martin J. Moran

[57] ABSTRACT

An electrical loadcenter of the kind for utilization in a trailer, mobile home or modular home is taught. The loadcenter is of the kind which has the main body thereof recessed into a wall portion and which has a protective cover which electrically and physically protects parties outside of the loadcenter from the electrical devices disposed inside of the loadcenter. A decorative cover is attached to the top of the primary cover for concealing the utilitarian appearance of the loadcenter cover. This decorative cover is typically flat and may either be painted or wallpapered to match the surrounding environment in which it is disposed.

17 Claims, 4 Drawing Sheets

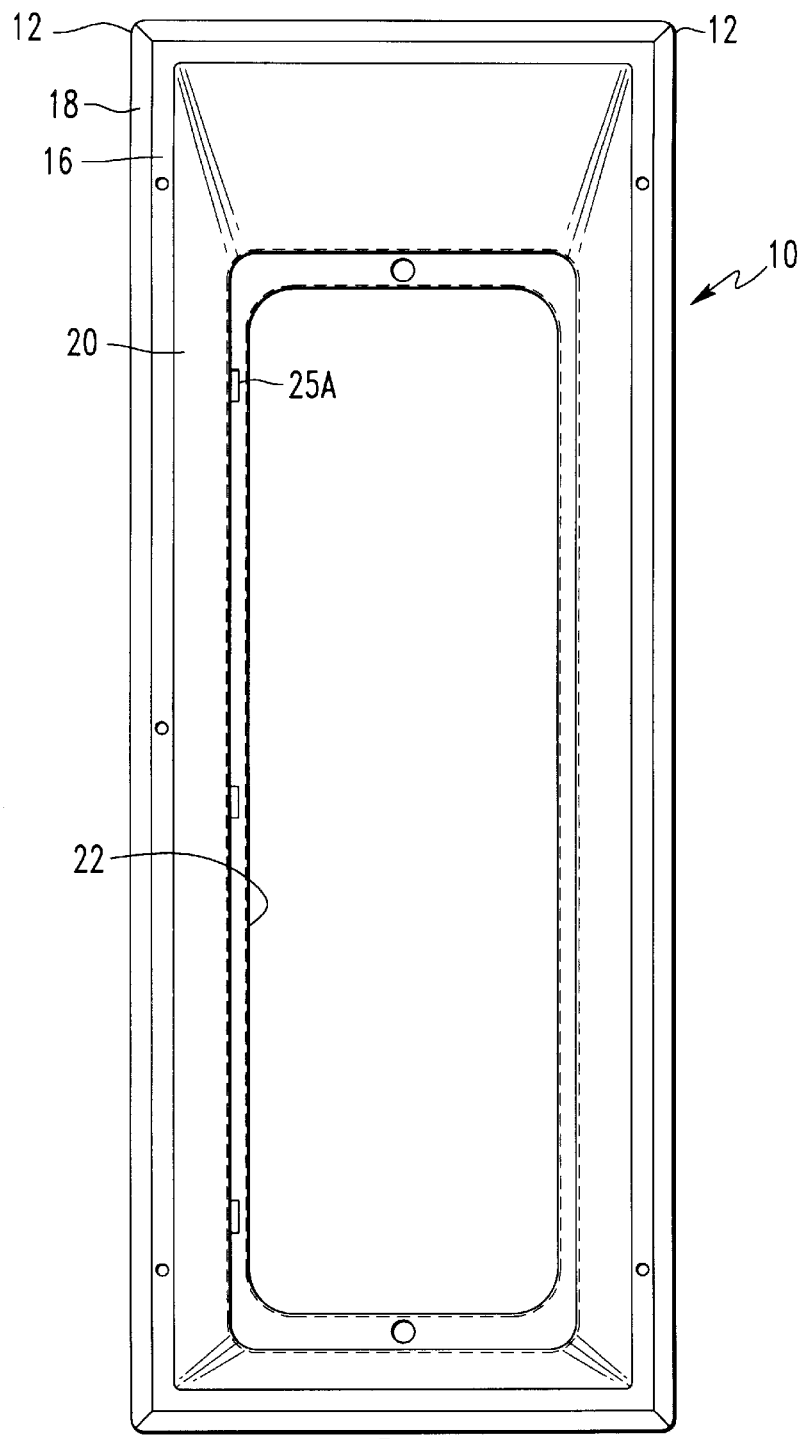
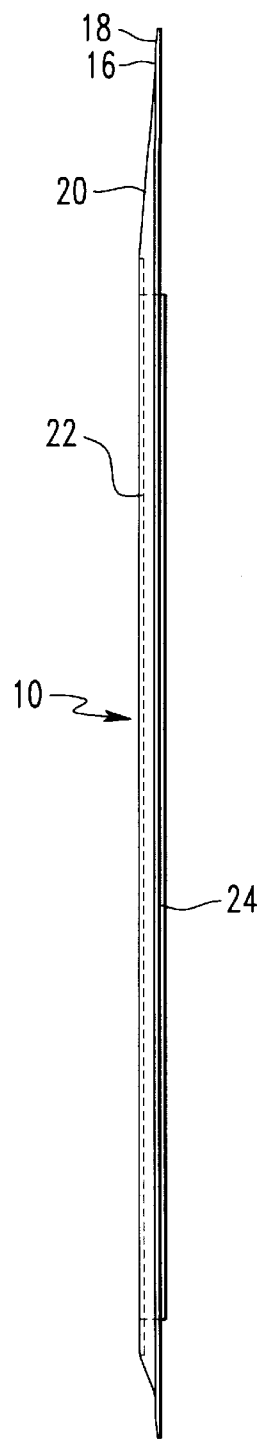
FIG. 1A
PRIOR ART
FIG. 1B
PRIOR ART
FIG. 1C
PRIOR ART 5,929,379

LOADCENTER SECONDARY DECORATIVE COVER

BACKGROUND OF THE INVENTION

1. Field of the Invention

The subject matter of this invention relates generally to electrical loadcenters and more specifically to decorative, secondary covers for electrical loadcenters.

2. Description of the Prior Art

Electrical loadcenters are known to generally comprise a recessible metal case in which miniature electrical circuit breakers or the like are disposed for protecting branch circuits in residential situations.

Loadcenters find many uses, many of which are in private homes or residences whether they be single family or multiple family. Quite often these loadcenters are located in the basement of such a building out of sight of viewers with a functional protective cover which is not necessarily aesthetically pleasing.

However, loadcenters may also be utilized in homes or apartments where there are no basements and where the loadcenter may be in plain view in the major living areas of the residence. It has been found in the latter situation that the utilitarian covers of the loadcenter are often unsightly to those in the living areas, especially if the surrounding living area is paneled or painted or otherwise aesthetically decorated.

It would be advantageous, therefore, if a way could be found to utilize a functional electrical loadcenter in the main living areas of a residence such as a modular home or trailer, where the undesirable aesthetic features of the loadcenter could be conveniently concealed.

SUMMARY OF THE INVENTION

In accordance with the invention, an electrical loadcenter is recessed in a wall. It includes a protective metal cover which is substantially flush with the wall and which substantially covers and protects the internal portions of the loadcenter. A second non-metallic, decorative, cover is provided for overlaying the first cover. The second or decorative cover has a surface which is decorative when used in conjunction with the wall. The second non-metallic cover may be substantially flat and the decorative function may be provided by way of paint or wallpaper. The aforementioned secondary cover may be hinged to the loadcenter on one side and magnetically affixed to the loadcenter on the other or magnetically affixed on all sides. In one embodiment of the invention the protective metal cover is steel and the secondary decorative cover is plastic.

BRIEF DESCRIPTION OF THE DRAWINGS

In accordance with the teachings of the invention, reference may be had to the preferred embodiment thereof shown in the accompanying figures in which:

FIG. 1A is a front view of a prior art loadcenter without its protective cover in place;

FIG. 1B is a side view of the cover of FIG. 1A;

FIG. 1C is a bottom view of the cover of FIG. 1A;

DESCRIPTION OF THE PREFERRED EMBODIMENT

Figures 2A, 2B, 2C:
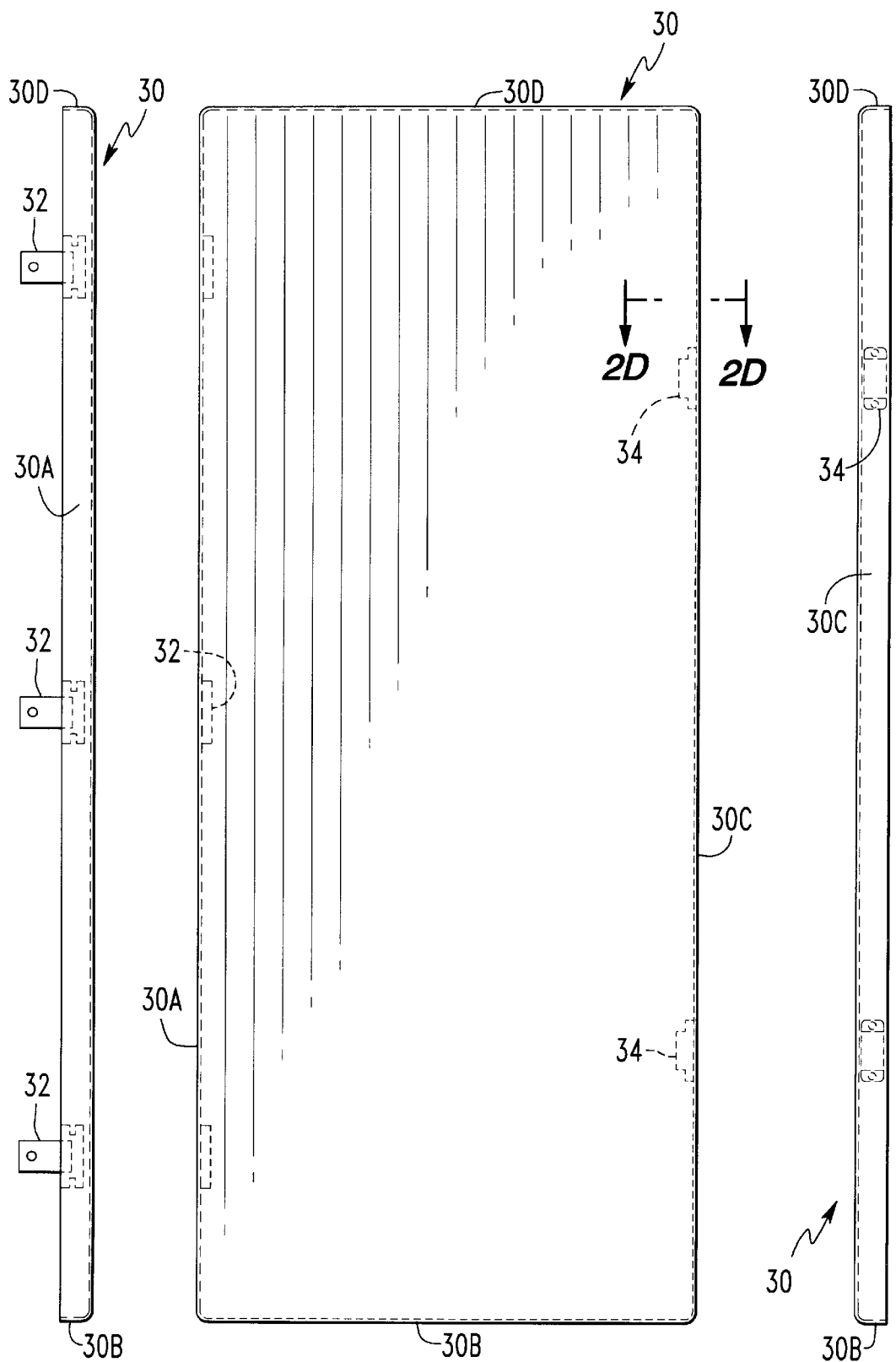
FIG. 2A is a front view of a decorative cover for use with the loadcenter of FIG. 1A.
FIG. 2B is a right side elevation of the decorative front cover of FIG. 2A.
FIG. 2C is a left side elevation of the decorative front cover of FIG. 2A.

Referring now to the drawings of FIGS. 1A through 1C, a prior art loadcenter front panel arrangement is depicted. In particular, the prior art front panel 10 comprises a peripheral edge 12. There is provided a relatively flat plateau 16 joined to the peripheral edge 12 by way of a first angled plane 18. There is a second angled plane 20 in-board of the plateau 16 adjoining the plateau 16 to the door region or opening 22. Convenient hinge members 25A are provided for a protective door which is shown most clearly in FIG. 4 at 23. There are provided protective lips 24 adjacent the opening 22 which protrude downwardly or away from door 23 to overlap similar, complementary protective lips on a front pan (not shown) which covers the circuit interrupter apparatus or similar equipment disposed within the main volume of the loadcenter 10.

Figure 2D:
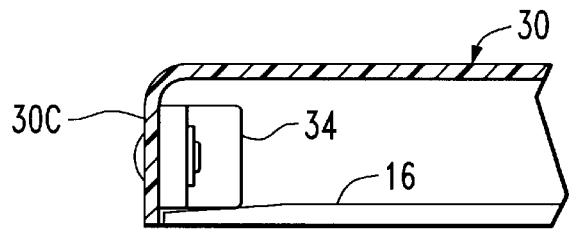
FIG. 2D is a view of the magnetic latch of the load center of FIG. 2A as seen in the direction of the arrow 2D—2D in FIG. 2A.

Referring now to FIGS. 2A through 2D the decorative, secondary cover 30 of the present invention is depicted. Cover 30 comprise a plastic front piece having raised lips 30A, 30B, 30C and 30D extending at right angles from the periphery of the cover 30. There may be provided on the lip 30A a securely attached set of hinges 32 and on the opposite lip 30C a set of affix attached magnetic members or latches 34 for securing the secondary cover 30 to the loadcenter 10. In another embodiment of the invention magnetic member 34 may be placed on all sides of the cover 30. FIG. 2D shows the arrangement of the magnetic attachment member 34 with respect to the decorative cover 30 in the relatively flat region or plateau region 16 of the prior art loadcenter 10.

Figure 3:
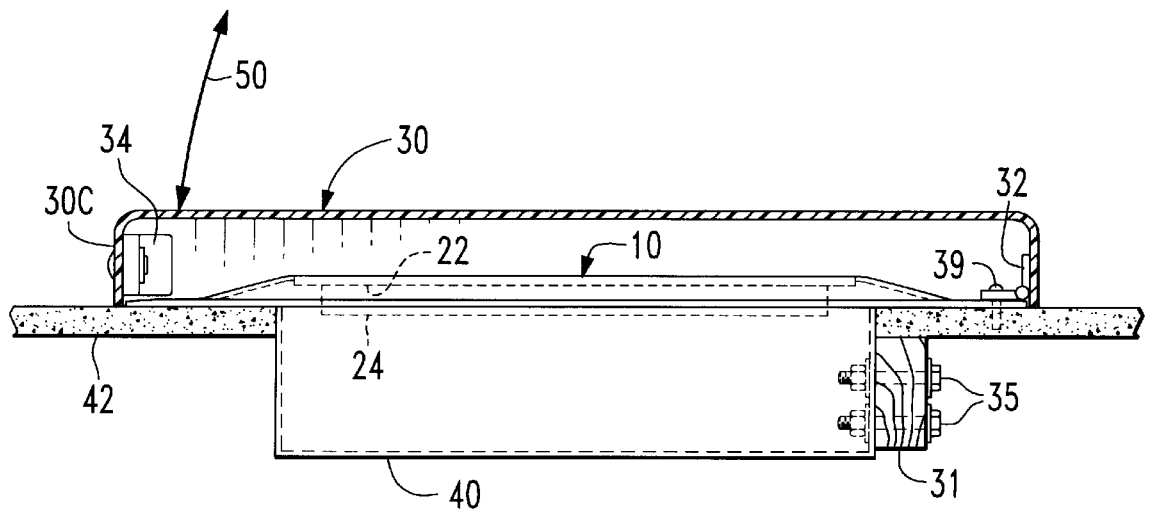
FIG. 3 is a cross-sectional view of a mounted and recessed loadcenter such as shown in FIGS. 1A through 1C with the decorative cover of FIGS. 2A through 2C in place.

FIG. 3 depicts a cross section of a loadcenter recessed within the region of a wall. The main body of the loadcenter 40 is attached to a wall stud 31, for example, by way of attachment devices 35 which may be common bolts and nuts or nails. The residence walls 42 are depicted. The recessed member 40 protrudes through an opening in the wall 42 such that the prior loadcenter front panel 40 abuts against the outer surface of the wall 42. The hinged decorative cover 30 which is hinged to the prior art cover 10 and secured thereto at 39 is depicted. The magnetic member 34 which is attached to the lip 30C affixes the open end of the cover 30 to the metallic prior art member 10 when the cover 30 is in the closed position. The cover 30 may be opened and closed upon the prior art member 10 in the rotational direction shown at 50.

Figure 4:
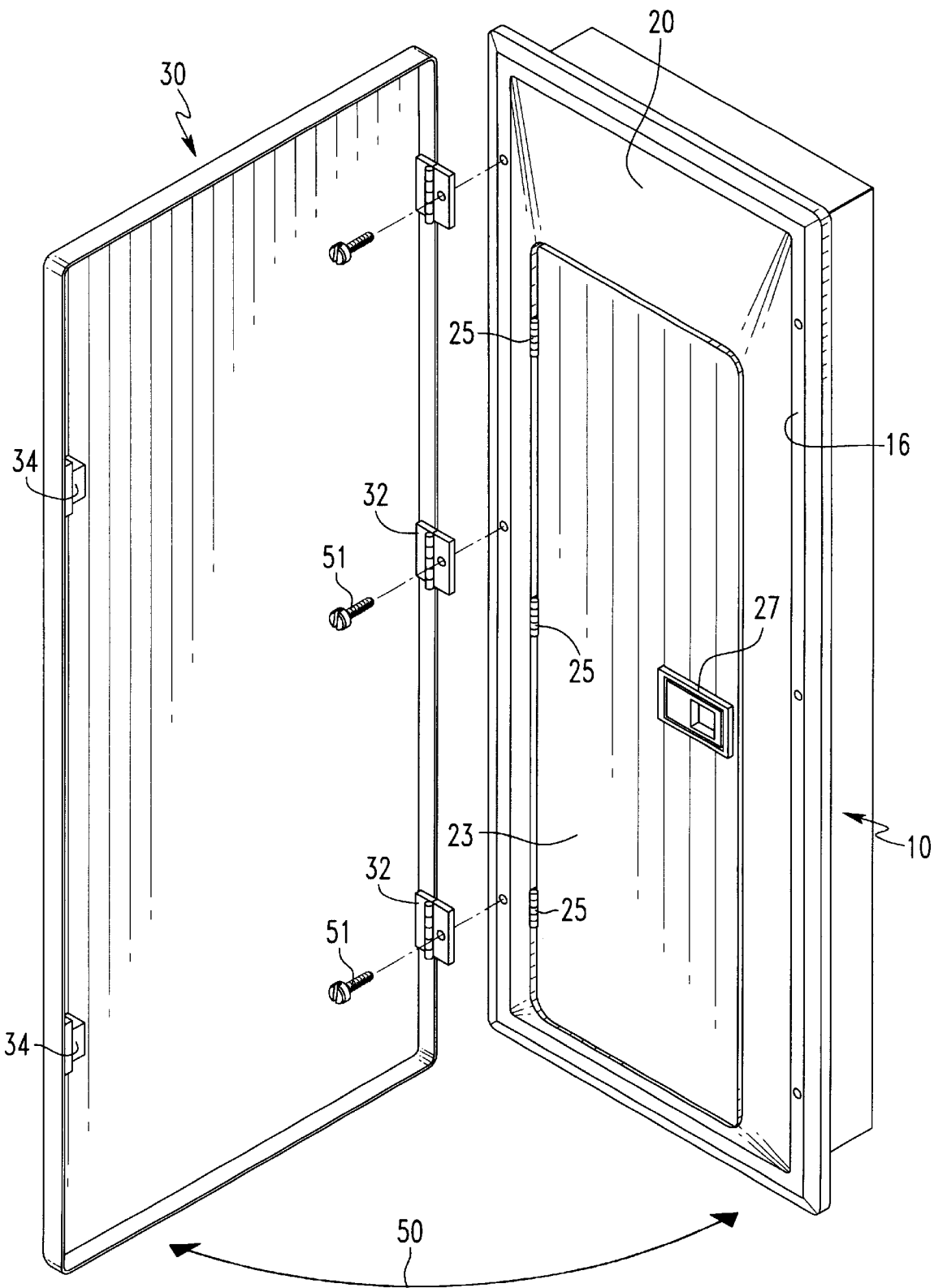
FIG. 4 is a exploded orthogonal view of the loadcenter of FIGS. 1A through 1C including the protective front cover with the decorative cover of FIGS. 2A through 2C shown.

Referring to FIG. 4, a view of a protective cover and loadcenter 10 as well as its decorative cover 30 is depicted. In particular in this embodiment of the invention prior art loadcenter 10 has connected to the front thereof a primary cover 23 which is hinged at 25 to the main body of the loadcenter 10. The second angled planes 20 and the flat plateau 16 are clearly shown. The hinge member 32 of the decorative cover 30 may be attached to the loadcenter 10 at the region shown at 16 by way of an attachment means such as a screw 51.

In a preferred embodiment of the invention, the decorative or secondary cover 30 may be made of plastic material which is amenable to being painted or wallpapered over or otherwise decoratively enhanced.

It is to be understood with respect to the embodiments of this invention that the loadcenter arrangement showed here is not limiting and that the particular cover arrangement maybe utilized with loadcenters of various sizes.

What is claimed is:

1. An electrical loadcenter of the kind which is recessed in a wall, comprising:

a protective metal cover which is openable and which is substantially flush with said wall and which substantially completely covers and protects an internal portion of said loadcenter when closed; and a second non-metallic cover for completely overlaying said protective metal cover, said second cover having a surface which is decorative when used in conjunction with said wall.

2. The combination as claimed in claim 1, wherein said second non-metallic cover is substantially flat.

3. The combination as claimed in claim 1, wherein said second non-metallic cover carries a coat of paint.

4. The combination as claimed in claim 3, wherein said coat of paint is the same color as said wall.

5. The combination as claimed in claim 1, wherein said second non-metallic cover carries wallpaper.

6. The combination as claimed in claim 5, wherein said wall is covered by wallpaper of a given pattern and where said wall paper on said second cover has substantially the same pattern.

7. The combination as claimed in claim 1, wherein said wall is covered by a decorative medium and wherein said second cover has substantially the same decorative medium disposed thereon.

8. The combination as claimed in claim 1, wherein said second cover is hinged to said loadcenter.

9. The combination as claimed in claim 1, wherein said second cover is magnetically affixed to said loadcenter.

10. The combination as claimed in claim 1, wherein one side of said second cover is hinged to said loadcenter, and wherein an opposite side of said second cover is magnetically latched to said loadcenter when said second cover is closed over said protective metal cover.

11. An electrical loadcenter of the kind which is recessed in a wall, comprising:

a steel protective cover which is openable and which is substantially flush with said wall and which substantially completely covers and protects an internal portion of said loadcenter from access when closed; and a second substantially decorative cover for completely overlaying said steel cover, said second cover having a surface which is aesthetically amenable with said wall.

12. An electrical loadcenter of the kind which is mounted to a wall, comprising:

a protective cover which is openable and which substantially completely covers and protects an internal portion of said loadcenter from access when closed, said protective cover being aesthetically non-amenable with said wall when closed; and a second substantially decorative cover for completely overlaying said protective cover, said second cover having a surface which is aesthetically amenable with said wall.

13. Electrical apparatus of the kind which is mounted to a wall, comprising: a protective cover which is openable and which substantially completely covers and protects an internal portion of said electrical apparatus from access when closed, said protective cover being aesthetically non-amenable with said wall; and a second substantially decorative cover for completely overlaying said protective cover, said second cover having a surface which is aesthetically amenable with said wall.

14. An electrical load center of the kind which is recessed in a wall, comprising:

a protective metal cover which is openable and which is substantially flush with said wall and which substantially completely covers and protects an internal portion of said loadcenter, said protective cover being aesthetically non-amenable with said wall when closed; and a second non-metallic cover for completely overlaying said first cover, said second cover having a surface which is decorative when used in conjunction with said wall and which is aesthetically amenable with said wall.

15. An electrical loadcenter of the kind which is recessed in a wall, comprising:

a steel protective cover which is openable and which is substantially flush with said wall and which substantially completely covers and protects an internal portion of said loadcenter from access when closed; and a second substantially plastic, decorative cover for completely overlaying said steel cover, said second cover having a surface which is aesthetically amenable with said wall.

16. The combination as claimed in claim 14 where said surface is painted.

17. The combination as claimed in claim 14 where said surface is wallpapered.

* * * * *